(12) United States Patent
Kenders et al.

(10) Patent No.: US 10,042,036 B2
(45) Date of Patent: Aug. 7, 2018

(54) PSEUDO-DOPPLER SHIFT THREE DIMENSIONAL LOCATION MAPPING

(71) Applicant: CA, Inc., New York, NY (US)

(72) Inventors: Richard George Kenders, Fort Collins, CO (US); Ben Charles Nelson, Loveland, CO (US)

(73) Assignee: CA, Inc., New York, NY (US)

( * ) Notice: Subject to any disclaimer, the term of this patent is extended or adjusted under 35 U.S.C. 154(b) by 521 days.

(21) Appl. No.: 14/671,673

(22) Filed: Mar. 27, 2015

(65) Prior Publication Data
US 2016/0282446 A1    Sep. 29, 2016

(51) Int. Cl.
*G01S 5/04*    (2006.01)
*G01S 3/46*    (2006.01)
*H05K 7/14*    (2006.01)

(52) U.S. Cl.
CPC ............... *G01S 5/04* (2013.01); *G01S 3/46* (2013.01); *H05K 7/1498* (2013.01)

(58) Field of Classification Search
CPC ... G01S 5/04; G01S 3/46–3/50; H05K 7/1498
See application file for complete search history.

(56) References Cited

U.S. PATENT DOCUMENTS

| | | | | |
|---|---|---|---|---|
| 5,426,438 | A | * | 6/1995 | Peavey ................. G01S 3/46 342/432 |
| 7,515,105 | B2 | * | 4/2009 | Whalley ............... G01S 5/0009 342/465 |
| 8,797,213 | B2 | * | 8/2014 | Pun ..................... G01S 3/043 342/442 |
| 2006/0167624 | A1 | * | 7/2006 | Whalley ............... G01S 5/0009 342/465 |
| 2011/0210849 | A1 | * | 9/2011 | Howard ............ G08B 13/1427 340/539.32 |
| 2014/0292582 | A1 | * | 10/2014 | Ware .................... G01S 5/04 342/450 |

* cited by examiner

*Primary Examiner* — Cassi J Galt
(74) *Attorney, Agent, or Firm* — Baker Botts L.L.P.

(57) ABSTRACT

An apparatus for a radar antenna mapping system is described. The system comprises a plurality of antenna arrays configured to receive signals emitted from a transmitter. The system further comprises wherein the transmitter emits signals of a plurality of frequencies, wherein the transmitter is coupled to a component within a data center, and wherein each of the plurality of antenna arrays are configured to receive a signal of one of the plurality of frequencies. The plurality of antenna arrays each comprise a plurality of antenna elements configured to determine a location of the transmitter in a respective coordinate plane by receiving signals of one of the plurality of frequencies. The system further comprises a computer with a central processor configured to determine the location of the transmitter based upon the signals received by the plurality of antenna arrays and construct a map of the location of the component.

22 Claims, 5 Drawing Sheets

PSEUDO-DOPPLER SHIFT THREE DIMENSIONAL LOCATION MAPPING

BACKGROUND

The present disclosure relates to psuedo-doppler shift radar system and, in particular, to an apparatus, computer-readable medium, and method for three dimensional location mapping.

SUMMARY

According to an embodiment of the present disclosure, a method comprising receiving signals emitted from a transmitter, via a plurality of antenna arrays, each of the plurality of antenna arrays arranged in a respective coordinate plane, wherein the transmitter emits signals of a plurality of frequencies, and wherein the transmitter is coupled with a component disposed within a data center. The method further comprising wherein each of the plurality of antenna arrays are configured to receive a signal of one of the plurality of frequencies. The method further comprising determining a location of the transmitter in the respective coordinate plane, via a plurality of antenna elements on each of the plurality of antenna arrays, wherein each of the plurality of antenna elements receive signals of one of the plurality of frequencies. The method further comprising mapping the location of the component, via a computer coupled to the plurality of antenna arrays, wherein the computer comprises a central processor configured to determine the location of the transmitter based upon the signals received by the plurality of antenna arrays.

According to another embodiment of the present disclosure, an apparatus configured to perform the aforementioned method.

According to another embodiment of the present disclosure, a computer program product comprising a computer-readable storage medium having computer-readable program code embodied therewith, the computer-readable program comprising computer-readable program code configured to perform the aforementioned method.

Other objects, features, and advantages will be apparent to persons of ordinary skill in the art in view of the following detailed description and the accompanying drawings.

BRIEF DESCRIPTION OF THE DRAWINGS

For a more complete understanding of the present disclosure, needs satisfied thereby, and the objects, features, and advantages thereof, reference now is made to the following description taken in connection with the accompanying drawings. Embodiments of the present disclosure, and their features and advantages, may be understood by referring to FIGS. 1-5, like numerals being used for corresponding parts in the various drawings.

DETAILED DESCRIPTION

As will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely in hardware, entirely in software (including firmware, resident software, micro-code, etc.) or combining software and hardware implementation that may all generally be referred to herein as a "circuit," "module," "component," or "system." Furthermore, aspects of the present disclosure may take the form of a computer program product embodied in one or more computer readable media having computer readable program code embodied thereon.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language, such as JAVA®, SCALA®, SMALLTALK®, EIFFEL®, JADE®, EMERALD®, C++, C#, VB.NET, PYTHON® or the like, conventional procedural programming languages, such as the "C" programming language, VISUAL BASIC®, FORTRAN® 2003, Perl, COBOL 2002, PHP, ABAP®, dynamic programming languages such as PYTHON®, RUBY® and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatuses (systems) and computer program products according to aspects of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular aspects only and is not intended to be limiting of the disclosure. As used herein, the singular forms "a," "an," and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

A managed environment is a collection of components that are to be physically located in a three dimensional space. A data center is an example of a managed environment. Within the data center are several components such as computing devices or servers. In one non-limiting embodiment, a server farm may be considered a data center and a server may be considered a component. Computing devices may perform various tasks including housing databases, serving files or web sites, storing data, routing data, etc. In some data centers, a computing device may occupy multiple locations within the data center. Computing devices may be moved to a new location at will or as needed. Furthermore, these devices are oftentimes relocated to redesign or reconfigure portions of the data center to adjust functionality. For example, in a data center context, a cabinet may house several computing devices that may be relocated to another cabinet within the data center. As a result, a common maintenance issue is physically locating computing devices in the data center.

Current mapping techniques may include keeping up a log of the location of each computing device, but this method is time consuming and may result in inaccuracies due to aging information. Accordingly, there is a need in the marketplace for a system that has the ability to map the physical location of components throughout a managed environment. From an efficiency and cost standpoint, the current disclosure provides an effective solution by using an antenna system and corresponding transmitters to generate a three dimensional map illustrating the location of physical components in a managed environment. Embodiments of the present disclosure may address the above problems, and other problems, individually and collectively.

A managed environment may include any three dimensional space that contains components that require physical location mapping within that three dimensional space. A computing device may be any digital device capable of processing data, storing data, manipulating data, transmitting data, receiving data, or any digital operations. Computing devices may have the ability to communicate via a universal serial bus (USB). A component may be anything with a physical embodiment capable of having its physical location determined and mapped within a three dimensional space. Components may include a computing device, a car, a desk, a plant, an X-ray machine, a server, a server rack, a corner of a room, or anything else capable of being mapped within a three dimensional space.

Figure 1:
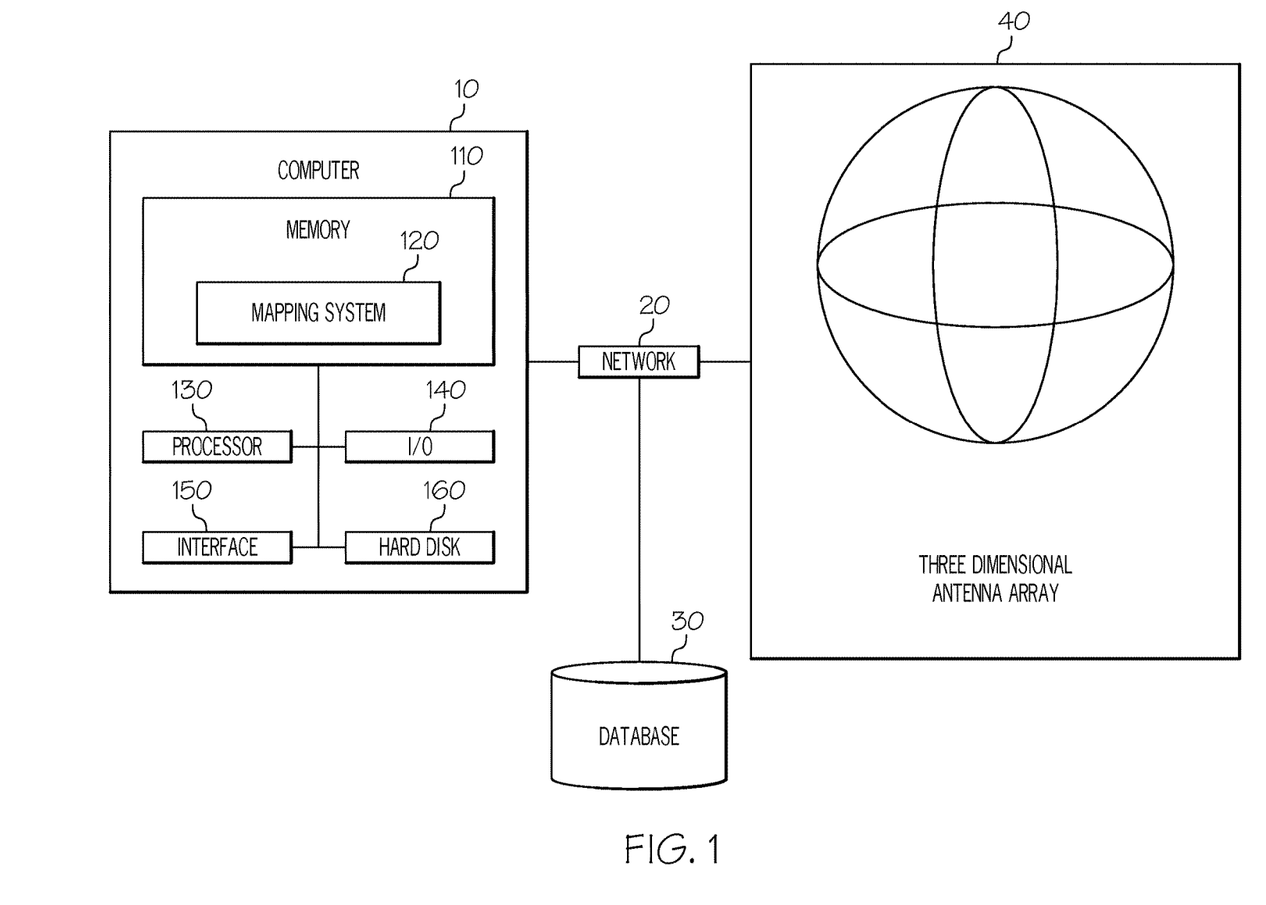
FIG. 1 is a schematic representation of the mapping ecosystem in accordance with a non-limiting embodiment of the present disclosure.

FIG. 1 is a schematic representation of the mapping ecosystem in accordance with a non-limiting embodiment of the present disclosure. The mapping ecosystem may include a computer 10 with a processor 130, an input and output ("I/O") device 140, an interface 150, and a hard disk 160. The computer 10 may also include a memory 110. The memory may include a mapping system 120. Processor 130 may be operable to load instructions from hard disk 160 into memory 110 and execute those instructions. Memory 110 may store computer-readable instructions that may instruct the computer 10 to perform certain processes. I/O device 140 may receive data from a server or network. A database 30 may store information and data regarding any portion of the map generation process. The database 30 may be connected to the network 20. An antenna system 40 may be connected to the computer 10 and the database via the network 20.

The network 20 may comprise one or more entities, which may be public, private, or community based. The network 20 may permit the exchange of information and services among users/entities that are connected to such network 20. In certain configurations, the network 20 may be a local area network, such as an intranet. Further, the network 20 may be a closed, private network/cloud in certain configurations, and an open network/cloud in other configurations. The network 20 may facilitate wired or wireless communications of information and provisioning of services among users that are connected to the network 20.

Figure 2:
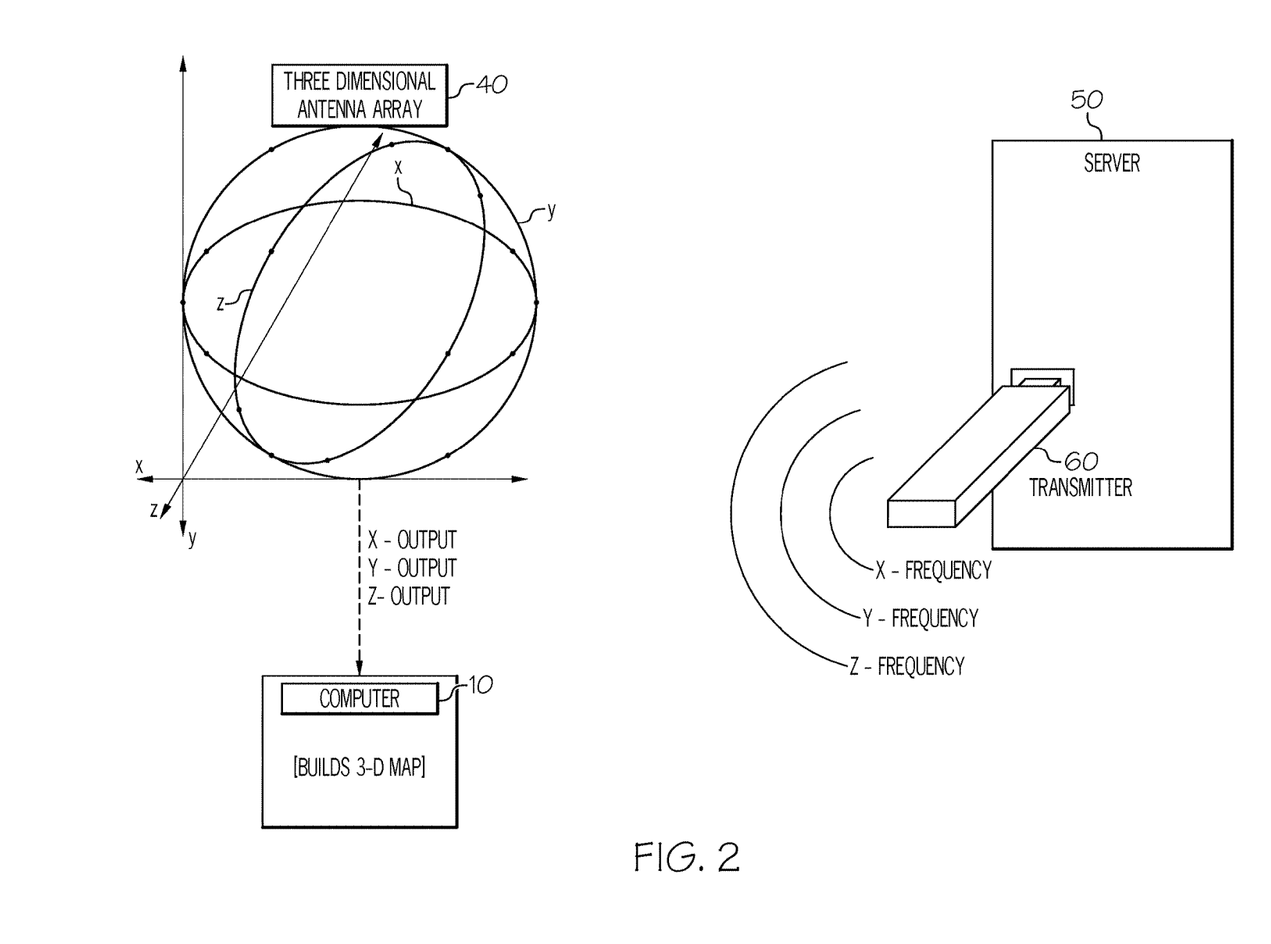
FIG. 2 illustrates a mapping generation process in accordance with a non-limiting embodiment of the present disclosure.

FIG. 2 illustrates a mapping generation process in accordance with a non-limiting embodiment of the present disclosure. The antenna system 40 in FIG. 2 is three dimensional and includes three antenna arrays, each corresponding to a coordinate plane. In the non-limiting embodiment shown in FIG. 2, the antenna system 40 consists of an antenna array corresponding to an x-coordinate plane, an antenna array corresponding to a y-coordinate plane, and an antenna array corresponding to a z-coordinate plane. The three coordinate planes may be three orthogonal coordinate planes. In another non-limiting embodiment of the present disclosure, the antenna system 40 may have duplicate antenna arrays for each coordinate plane to verify location accuracy. Furthermore, the mapping ecosystem may have multiple antenna systems 40 to determine an accurate location of a transmitter 60.

In a non-limiting embodiment of the present disclosure, the transmitter 60 may transmit four radio frequency signals: three signals for three dimensional location purposes (x, y, and z axis) and a fourth signal for Wi-Fi protocols used broadly between components or computing devices. Computing devices may include smart phones, tablets, laptops, wireless printers, etc. The transmitter 60 itself may be comprised of two internal transmitters, one internal transmitter for Wi-Fi communications and the other for transmitting the x, y, and z location frequencies.

A transmitter 60 is shown in FIG. 2 connected to a computing device. In this non-limiting embodiment, the computing device is a server 50. The transmitter 60 may be designed to emit signals of several different frequencies. The transmitter 60 may also be able to connect to a Wi-Fi network to transmit and receive information. The transmitter 60 may also be connected to a network via the server to which the transmitter 60 is coupled. In a non-limiting embodiment, the transmitter 60 may emit signals in order for the antenna system 40 to detect the location of the transmitter 60. The transmitter 60 may receive power from a power source, such as, for example, server 50. Additionally, the transmitter 60 may include its own source of power.

In FIG. 2, the antenna system 40 may receive transmissions from a transmitter 60. The transmitter 60 may be connected or linked to a computing device such as a server 50. The transmitter emits signals of three different frequencies, each corresponding to the three different planes occupied by the three antenna arrays. For example, the transmitter 60 may transmit signals of a specific frequency (i.e., x-, y-, or z-frequency) to be received by corresponding antenna arrays (i.e., x-, y-, or z-coordinate antenna array). By receiving signals in each coordinate plane, the antenna system 40 may output the transmitter's 60 three dimensional coordinate location in the three coordinate planes.

In some non-limiting embodiments, a number of transmitters 60 may be physically located anywhere for component location purposes. In the non-limiting embodiment shown in FIG. 2, the transmitter 60 may be located anywhere on a server 50 containing numerous computing devices within a server farm or data center. Each transmitter 60 may emit signals such that the antenna system 40 may receive location data of the transmitter 60. Using the location data, a computer 10 may generate a three dimensional map illustrating the location of each transmitter 60 and asset in the managed environment. In the present example, the computer 10 may generate a three dimensional map illustrating the location of each transmitter 60 and server 50 in a data center. The three dimensional map may help diagnose and locate issues with computing devices in a data center environment. Furthermore, the transmitter 60 may be a USB device coupled to a computing device via a USB port. In a non-limiting embodiment of the present disclosure, the transmitter 60 may be coupled to the server 50 via a USB port. The component may also be a specific cabinet, module in another computing device, router, switch, or anything that can physically occupy space in a data center. The transmitter 60 may also be used in any managed environment where there are multiple components to locate.

Furthermore, the transmitter 60 does not need to be connected to a computing device to operate. However, by plugging into a computing device via USB, the transmitter 60 may communicate with the computing device to determine additional information about that device. Absent a USB connection, the transmitter 60 is still capable of transmitting location signals for physically locating a component. As such, the transmitter 60 may be able to locate non-computing devices in a three dimensional managed environment.

For example, a company with a warehouse full of antique furniture may use this system to track the locations of their entire inventory. The transmitter 60 may be placed on an item when it is originally stored in the warehouse. The physical location of the item may then be stored in a database along with specific information about the item. When an order is fulfilled, the company may refer to a three dimensional map to determine the location of the ordered item. This process may be repeated for every item in the warehouse to develop a comprehensive three dimensional map of inventory. Additionally, the present disclosure is not limited to a data center or warehouse context, but may apply to any context where tracking physical location is desired.

Figure 3:
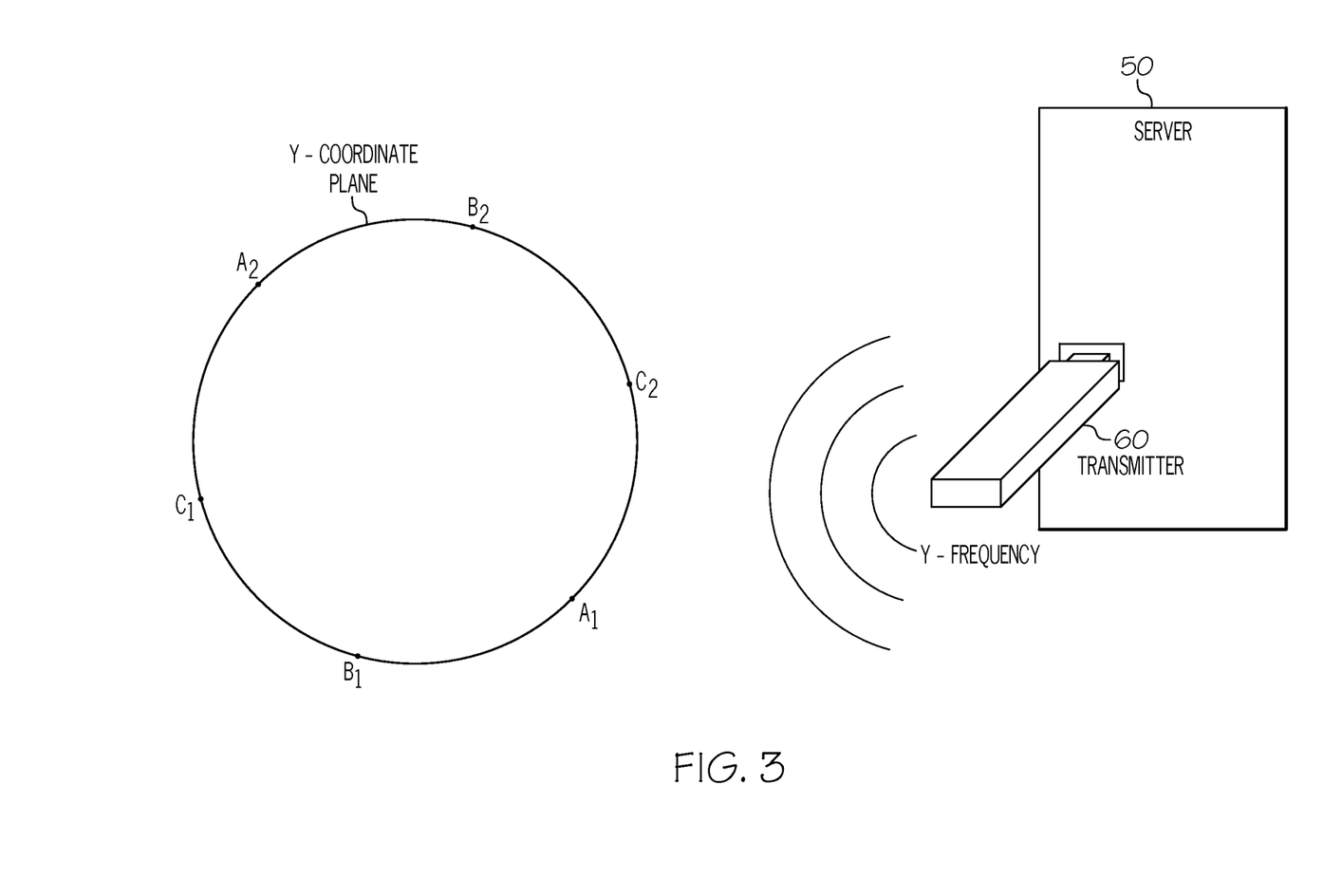
FIG. 3 illustrates a mapping generation process in a specific coordinate plane in accordance with a non-limiting embodiment of the present disclosure.

FIG. 3 illustrates a mapping generation process in a specific coordinate plane in accordance with a non-limiting embodiment of the present disclosure. The antenna system 40 may use a pseudo-doppler direction finding technique. The pseudo-doppler technique is a phase based direction finding method that produces a bearing estimate on the receive signal by measuring the doppler shift induced on the signal. This is accomplished by sampling around the elements of a circular array.

As depicted in FIG. 3, each antenna array may have a plurality of elements or nodes. These elements or nodes act as individual antennas for receiving signals emitted from a transmitter 60. The approach of a non-limiting embodiment of the present disclosure uses a circular array, as shown in FIG. 3, with each antenna pair (A1, and A2, B1 and B2, C1 and C2) sampled in succession.

The transmitter 60 and the antenna system 40 may be calibrated via a Wi-Fi network. The calibration may also occur manually, or the transmitter 60 and the antenna system 40 may be designed to collaborate at a precise time. Once the antenna system 40 and the transmitter 60 are calibrated, each antenna pair (A1, and A2, B1 and B2, C1 and C2) may be sampled in succession in uniform with the emission of the y-frequency signal emitted by the transmitter 60. The coordinate array may be able to discover the directional location of the transmitter 60 by determining which antenna first receives the signal. In the same manner, the antenna system 40 determines the directional location of the transmitter 60 in the x and z axis.

In FIG. 3 for example, as soon as the transmitter 60 emits a signal the antenna pair A1 and A2 are active. If A1 receives the signal in a fraction of time before A2, the antenna system 40 may determine the directional location of the signal for the respective antenna pair. In other words, the transmitter 60 emitting the signal is closer to A1 than A2. The antenna system 40 then shifts to the next antenna pair B1 and B2 and tests again for the transmitted signal. The shift may occur in uniformity with the transmitter 60 emitting the transmitted signal. If B1 receives the second signal in a fraction of time before B2, the antenna system 40 may determine the directional location of the transmitted signal for this respective pair. The antenna pairs are sampled in succession to determine the direction of the transmitter 60 in a coordinate plane. In the same manner, the antenna system 40 determines the directional location of the transmitter 60 in the x and z axis.

Since the antenna system 40 is calibrated with the transmitter 60, and because the speed of the signal is known, the system may calculate a y-coordinate for the transmitter 60. The antenna system 40 may then repeat this process in each coordinate plane to determine a three dimensional location of the transmitter 60. In a non-limiting embodiment, the antenna arrays and antenna elements are physically fixed but electronically controlled, allowing for the adjustment of the antenna's directionality absent physical motion.

Each transmitted signal may be comprised of a sine wave carrier and an embedded pulse. The pulse may be considered the signal. The carrier sine wave may carry the pulse at a fixed frequency that the receiving antenna array is tuned to receive.

Figure 4:
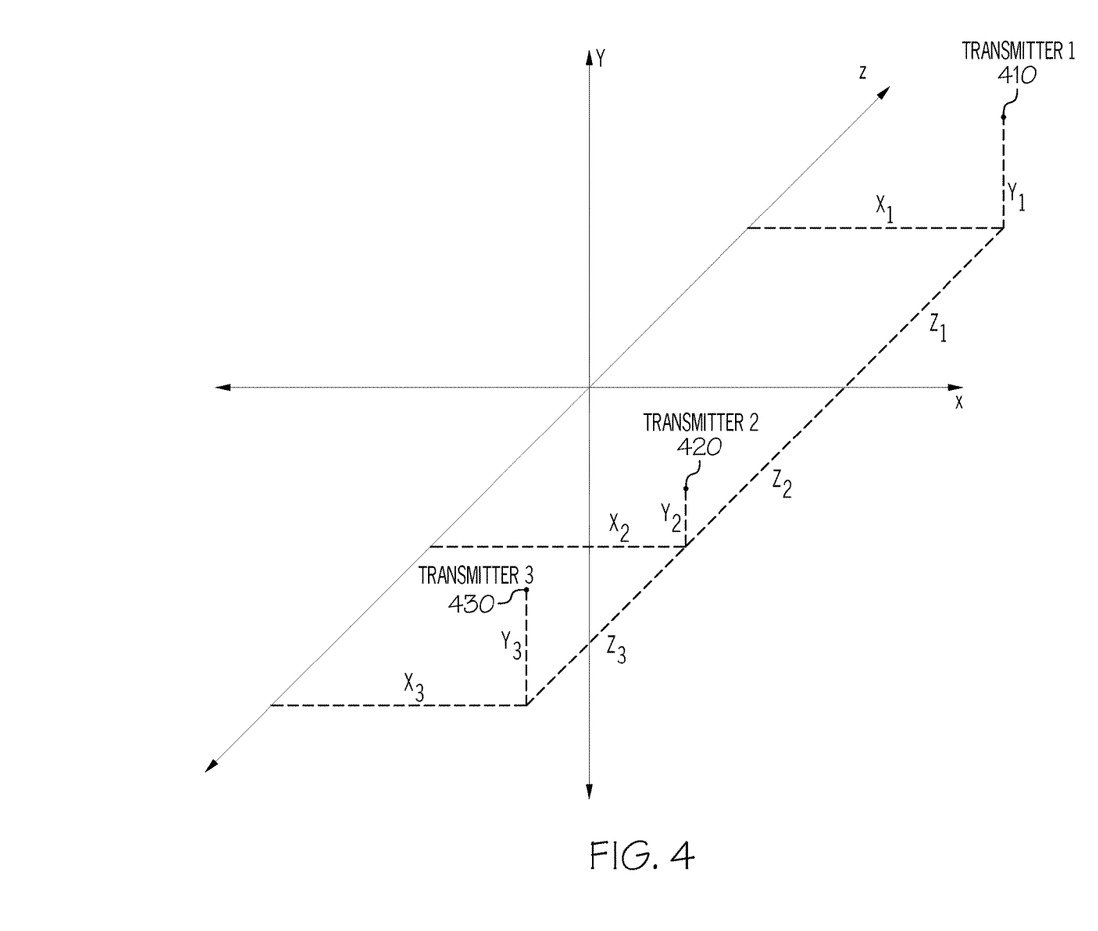
FIG. 4 illustrates a three dimensional mapping generation process in accordance with a non-limiting embodiment of the present disclosure.

FIG. 4 illustrates a three dimensional mapping generation process in accordance with a non-limiting embodiment of the present disclosure. The map in FIG. 4 depicts several transmitters 410, 420, and 430 according to their x, y, and z coordinates. Each transmitter shown in FIG. 4 may transmit signals such that the antenna system 40 may determine their location.

Figure 5:
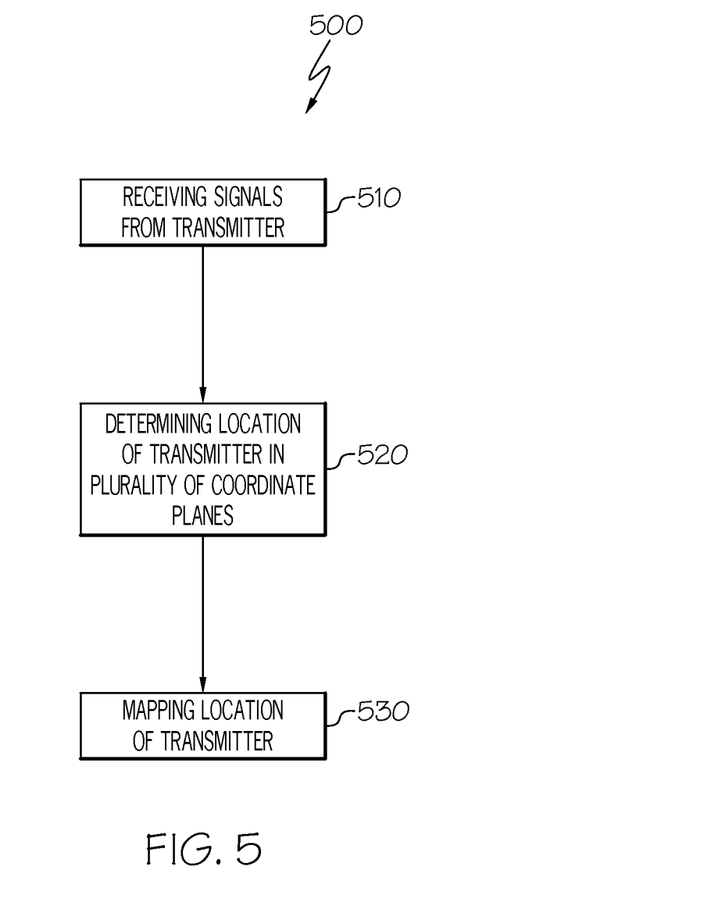
FIG. 5 is a flow chart of a three dimensional mapping generation process in accordance with a non-limiting embodiment of the present disclosure.

FIG. 5 is a flow chart of a three dimensional mapping generation process in accordance with a non-limiting embodiment of the present disclosure. In step 510, an antenna system 40 receives signals from a transmitter 60. The antenna system 40 may include a plurality of antenna arrays in any configuration. In step 520, the antenna system 40 may determine the location of a transmitter 40 in a plurality of coordinate planes. The antenna arrays may be in coordinate planes that differ from the non-limiting embodiments shown in FIGS. 1-3. In step 530, a computer 10 may receive data from the antenna system 40 sufficient to map the location of a transmitter 60, a server 40, or any asset in the managed environment.

The figures illustrate the architecture, functionality, and operation of possible implementations of systems, methods, and computer program products according to various aspects of the present disclosure. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The corresponding structures, materials, acts, and equivalents of any means or step plus function elements in the claims below are intended to include any disclosed structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

While the present disclosure has been described in connection with preferred embodiments, it will be understood by those of ordinary skill in the art that other variations and modifications of the preferred embodiments described above may be made without departing from the scope of the present disclosure. Other embodiments will be apparent to those of ordinary skill in the art from a consideration of the specification or practice of the present disclosure disclosed herein. It will also be understood by those of ordinary skill in the art that the scope of the disclosure is not limited to use in a server context, but rather that embodiments of the present disclosure may be used in any location determining context. The specification and the described examples are considered as exemplary only, with the true scope and spirit of the present disclosure indicated by the following claims.

What is claimed is:

1. A system comprising:
a plurality of antenna arrays, each of the plurality of antenna arrays arranged in a respective coordinate plane, the plurality of antenna arrays configured to receive signals emitted from a transmitter, wherein the transmitter is coupled with a component disposed within a data center;
wherein the plurality of antenna arrays comprises three antenna arrays, the three antenna arrays being arranged in three orthogonal axes;
wherein the transmitter emits signals of a plurality of frequencies, wherein each of the plurality of antenna arrays are configured to receive a signal of one of the plurality of frequencies;
wherein each one of the plurality of antenna arrays comprise computer hardware and a plurality of antenna elements, each one of the plurality of antenna arrays configured to determine a location of the transmitter in the respective coordinate plane by receiving signals of one of the plurality of frequencies;
a computer coupled to the plurality of antenna arrays, wherein the computer comprises a central processor configured to determine the location of the transmitter based upon the locations in the respective coordinate planes determined by the plurality of antenna arrays and construct a map of the location of the component; and
wherein the plurality of frequencies comprises four radio frequencies, and wherein three radio frequencies of the four radio frequencies are used to determine the location of the transmitter, and a fourth radio frequency of the plurality of frequencies is used for Wi-Fi protocols used for communication between the component and additional components within the data center.

2. The system of claim 1, wherein the map further comprises locations of additional components of the data center in a three dimensional space.

3. The system of claim 1, wherein the transmitter is coupled with the component via a universal serial bus port.

4. The system of claim 1, wherein each of the plurality of antenna arrays are configured to receive signals of differing frequencies.

5. The system of claim 1, wherein each plurality of antenna elements is configured to determine a location of the transmitter in the respective coordinate plane by use of a pseudo-doppler technique.

6. The system of claim 1, wherein the plurality of antenna arrays are fixed.

7. A method, comprising:
receiving signals emitted from a transmitter, via a plurality of antenna arrays, each of the plurality of antenna arrays arranged in a respective coordinate plane, wherein the transmitter emits signals of a plurality of frequencies, wherein the transmitter is coupled with a component disposed within a data center, and wherein each of the plurality of antenna arrays are configured to receive a signal of one of the plurality of frequencies;
wherein the plurality of antenna arrays comprises three antenna arrays, the three antenna arrays being arranged in three orthogonal axes;
determining a location of the transmitter in each of the respective coordinate planes, via computer hardware and a plurality of antenna elements on each of the plurality of antenna arrays, wherein each one of the plurality of antenna elements receive signals of one of the plurality of frequencies;
mapping the location of the component, via a computer coupled to the plurality of antenna arrays, wherein the computer comprises a central processor configured to determine the location of the transmitter based upon the locations in the respective coordinate planes determined by the plurality of antenna arrays; and
wherein the plurality of frequencies comprises four radio frequencies, and wherein three radio frequencies of the four radio frequencies are used to determine the location of the transmitter, and a fourth radio frequency of the plurality of frequencies is used for Wi-Fi protocols used for communication between the component and additional components within the data center.

8. The method of claim 7, further comprising mapping locations of a plurality of components of the data center in a three dimensional space.

9. The method of claim 7, wherein the transmitter is coupled with the component via a universal serial bus port.

10. The method of claim 7, wherein each of the plurality of antenna arrays are configured to receive signals of differing frequencies.

11. The method of claim 7, wherein determining a location of the transmitter in the respective coordinate plane further comprises using a pseudo-doppler technique.

12. The method of claim 7, wherein the plurality of antenna arrays are fixed.

13. A computer program product comprising:
a non-transitory computer-readable storage medium having computer-readable program code embodied therewith, the computer-readable program code comprising:
computer-readable program code configured to receive signals emitted from a transmitter, via a plurality of antenna arrays, each of the plurality of antenna arrays arranged in a respective coordinate plane, wherein the transmitter emits signals of a plurality of frequencies, wherein the transmitter is coupled with a component disposed within a data center, and wherein each of the plurality of antenna arrays are configured to receive a signal of one of the plurality of frequencies;
wherein the plurality of antenna arrays comprises three antenna arrays, the three antenna arrays being arranged in three orthogonal axes;
computer-readable program code configured to determine a location of the transmitter in each of the respective coordinate planes, via computer hardware and a plurality of antenna elements on each of the plurality of antenna arrays, wherein each one of the plurality of antenna elements receive signals of one of the plurality of frequencies;
computer-readable program code configured to map the location of the component, via a computer coupled to the plurality of antenna arrays, wherein the computer comprises a central processor configured to determine the location of the transmitter based upon the locations in the respective coordinate planes determined by the plurality of antenna arrays; and
wherein the plurality of frequencies comprises four radio frequencies, and wherein three radio frequencies of the four radio frequencies are used to determine the location of the transmitter, and a fourth radio frequency of the plurality of frequencies is used for Wi-Fi protocols used for communication between the component and additional components within the data center.

14. The computer program product of claim 13, further comprising:
computer-readable program code configured to map locations of additional components of the data center in a three dimensional space.

15. The computer program product of claim 13, wherein the transmitter is coupled with the component via a universal serial bus port.

16. The computer program product of claim 13, wherein each of the plurality of antenna arrays are configured to receive signals of differing frequencies.

17. The computer program product of claim 13, wherein determining a location of the transmitter in the respective coordinate plane further comprises using a pseudo-doppler technique.

18. The method of claim 7, further comprising calibrating the plurality of antenna arrays and the transmitter using the Wi-Fi protocols.

19. The method of claim 18, wherein each of the antenna arrays include at least one antenna pair comprising first and second antennas, and further comprising;
sampling the first and second antennas in succession;
determining the directional location of the transmitter in at least two of the coordinate planes, by determining which of the first and second antennas first receives a signal transmitted from the transmitter.

20. The system of claim 1, wherein the plurality of antenna arrays are configured to be calibrated using the Wi-Fi protocols.

21. The computer program product of claim 13, further comprising computer-readable program code configured for calibrating the plurality of antenna arrays and the transmitter using the Wi-Fi protocols.

22. The computer program product of claim 21, wherein each of the antenna arrays include at least one antenna pair comprising first and second antennas, and further comprising computer-readable program code configured for:
sampling the first and second antennas in succession;
determining the directional location of the transmitter in at least two of the coordinate planes, by determining which of the first and second antennas first receives a signal transmitted from the transmitter.

* * * * *